United States Patent
Huang et al.

(10) Patent No.: US 7,476,912 B2
(45) Date of Patent: Jan. 13, 2009

(54) MULTI-DIRECTIONAL LIGHT SCATTERING LED AND MANUFACTURING METHOD THEREOF

(75) Inventors: Cheng-Kuo Huang, Lung Tan (TW); Shyi-Ming Pan, Lung Tan (TW); Yun-Li Li, Lung Tan (TW); Huan-Che Tseng, Lung Tan (TW); Fen-Ren Chien, Lung Tan (TW)

(73) Assignee: Formosa Epitaxy Incorporation, Taoyuan County (TW)

( * ) Notice: Subject to any disclaimer, the term of this patent is extended or adjusted under 35 U.S.C. 154(b) by 264 days.

(21) Appl. No.: 11/409,003

(22) Filed: Apr. 24, 2006

(65) Prior Publication Data

US 2007/0246711 A1  Oct. 25, 2007

(51) Int. Cl.
*H01L 33/00* (2006.01)
(52) U.S. Cl. .................. 257/98; 257/103; 257/E33.074

(58) Field of Classification Search .................... 257/98, 257/103, E33.074, E33.068
See application file for complete search history.

(56) References Cited

U.S. PATENT DOCUMENTS

2005/0082562 A1*  4/2005  Ou et al. ..................... 257/103

* cited by examiner

*Primary Examiner*—Evan Pert
*Assistant Examiner*—Selim Ahmed
(74) *Attorney, Agent, or Firm*—Rosenberg, Klein & Lee

(57) ABSTRACT

A multidirectional light scattering LED and a manufacturing method thereof are disclosed. A metal oxide is irregular disposed over a second semiconductor layer and then is removed by etching. Part of the second semiconductor layer, part of a light-emitting layer or part of the first semiconductor layer is also removed so as to form a scattering layer. A transparent conductive layer is arranged over the second semiconductor layer while further a second electrode is disposed over the transparent conductive layer. A first electrode is installed on the scattering layer. Thus light output from the LED is scattered in multi-directions.

14 Claims, 7 Drawing Sheets

MULTI-DIRECTIONAL LIGHT SCATTERING LED AND MANUFACTURING METHOD THEREOF

BACKGROUND OF THE INVENTION

The present invention relates to a LED, especially to a multidirectional light scattering LED and a manufacturing method thereof that uses a scattering layer to cause output light to become scattering in multi-directions.

Since Light-emitting gallium nitride-based III-V group compound semiconductor devices are available on market at 1995, the manufacturing efficiency and yield rate are improved year after year. However, light output from LED is non-directional.

Refer to Taiwanese patent application No. 546452, applied on May 3, 2001, a LED illuminative device is disclosed. The device features on that a plurality of LED chips is disposed on surface of an insulated sphere. The LED chips are connected in series and wires are disposed on conductive parts of two ends. Transparent or translucent resin for package covers on the LED chips and part of the wires. The resin is mixed with powder of light scattering materials such as aluminum, gold, tungsten, titanium, or molybdenum.

Refer to FIG. 1, Taiwanese patent No. 229949, applied on Jan. 19, 2004, a light emitting diode and a manufacturing process thereof is disclosed. A light emitting diode includes a substrate 11', a n-type semiconductor layer 12', a light emitting layer 13', a p-type semiconductor layer 14', a transparent conductive layer 15', a n-type electrode 16' and a p-type electrode 17'. The transparent conductive layer 15' has a plurality of concave holes jogged inwards the surface of the epitaxy so as to increase brightness of the LED due to scattering of the light passed through the concave holes.

Furthermore, refer to FIG. 2, Taiwanese patent No. 221036, applied on Jun. 26, 2003, a light emitting diode and a manufacturing method thereof is disclosed. A light emitting diode includes a substrate 11', a mixing layer 18' with a rough layer for diffusing incident light disposed over the substrate 11', a n-type semiconductor layer 12' over the mixing layer 18', a light emitting layer 13' over the n-type semiconductor layer 12, and a p-type semiconductor layer 14' formed over the light emitting layer 13'. By the mixing layer 18', the incident light is diffused.

Therefore, it is learned that light output from LED only in single direction is an important issue to be solved.

SUMMARY OF THE INVENTION

Therefore it is a primary object of the present invention to provide a multidirectional light scattering LED. A scattering layer is disposed over a first semiconductor layer. By varying the etching depth, the scattering layer is made by removing material from the first semiconductor layer, the light emitting layer, the second semiconductor layer or combinations of them. The scattering layer uses metal oxide disposed irregularly so as to have needle-shape or columnar structure. By using this kind of structure, light being output from the light-emitting layer is multi-directionally scattered.

It is another object of the present invention to provide a multidirectional light scattering LED and a manufacturing method thereof. A refractive layer that is made from metal oxide is irregularly disposed over a second semiconductor layer so as to make light emitted from the light-emitting layer become multidirectional scattering.

In order to achieve above objects, the present invention provides a multidirectional light scattering LED and a manufacturing method thereof. A metal oxide is irregular disposed over a second semiconductor layer and then is removed by etching. Part of the second semiconductor layer, part of a light-emitting layer or part of the first semiconductor layer is also removed so as to form a scattering layer. A transparent conductive layer is arranged over the second semiconductor layer while further a second electrode is disposed over the transparent conductive layer. A first electrode is installed on the scattering layer. Thus light output from the LED is scattered in multi-directions.

Moreover, a refractive layer is irregularly arranged between the second semiconductor layer and the transparent conductive layer so as to make light output from LED become scattering in multi-directions.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

In order to solve the problem of direction of the output light, conventional way is to mix package materials with light scattering materials or by disposition of a light-mixing layer over the substrate. The present invention disposes a scattering layer over a first semiconductor layer so as to achieve above objects.

Figure 1:
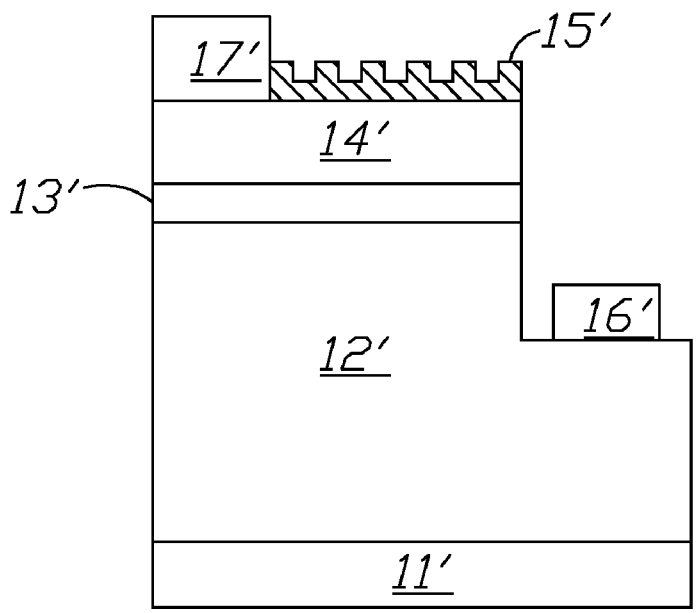
FIG. 1 is a schematic drawing showing structure of a conventional LED with higher light emitting efficiency.
Figure 2:
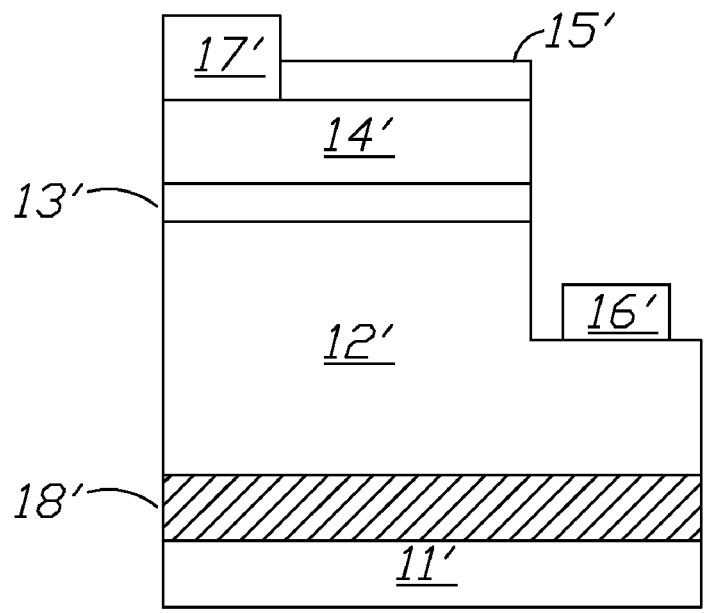
FIG. 2 is a schematic drawing showing structure of a conventional LED with higher light emitting efficiency.
Figure 3A:
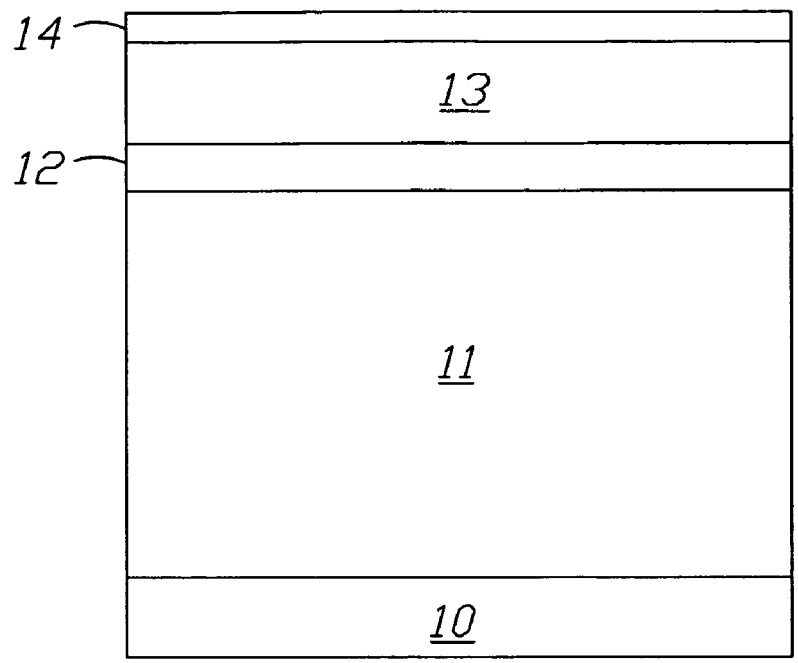
FIG. 3A to FIG. 3D are schematic drawings showing manufacturing processes of an embodiment according to the present invention.
Figure 3B:
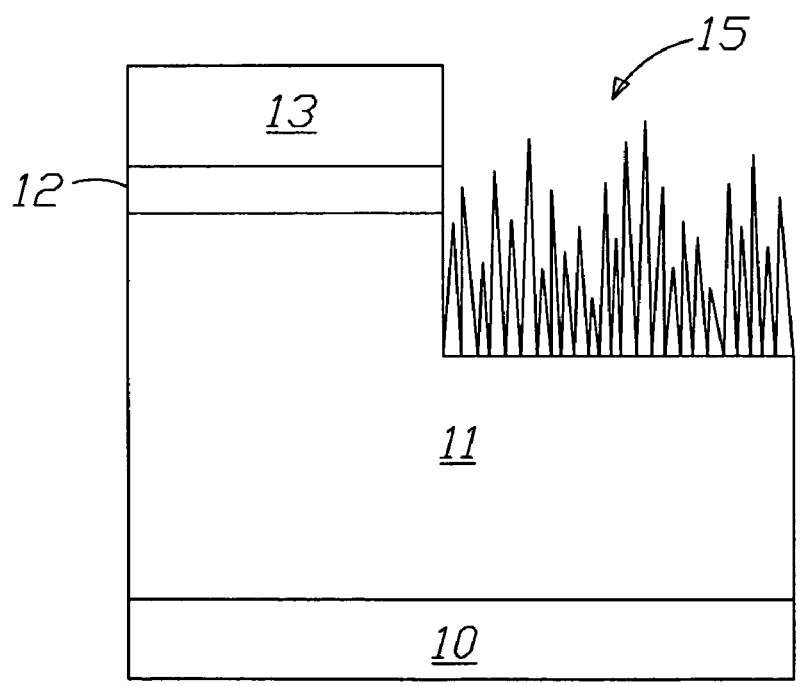
Figure 3C:
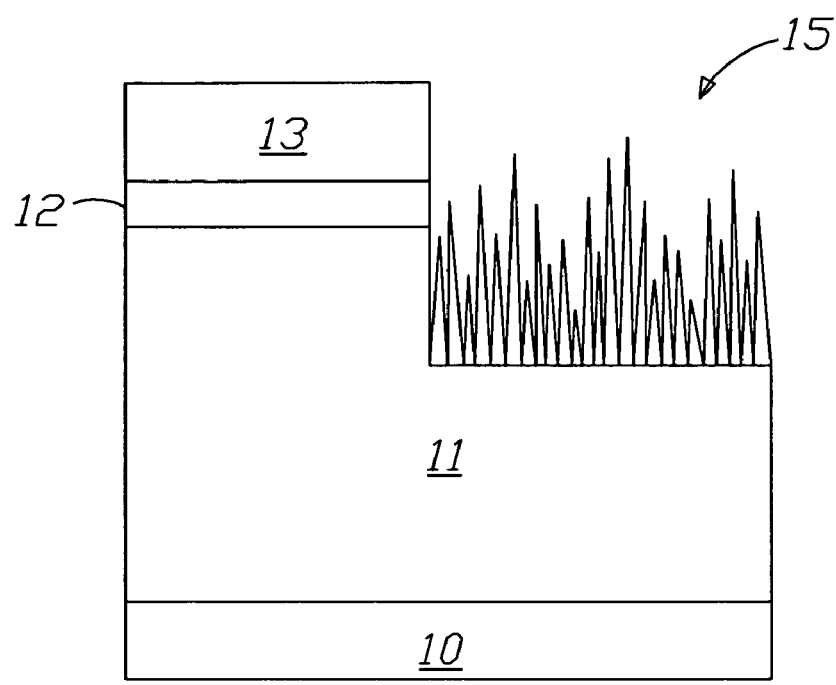
Figure 3D:
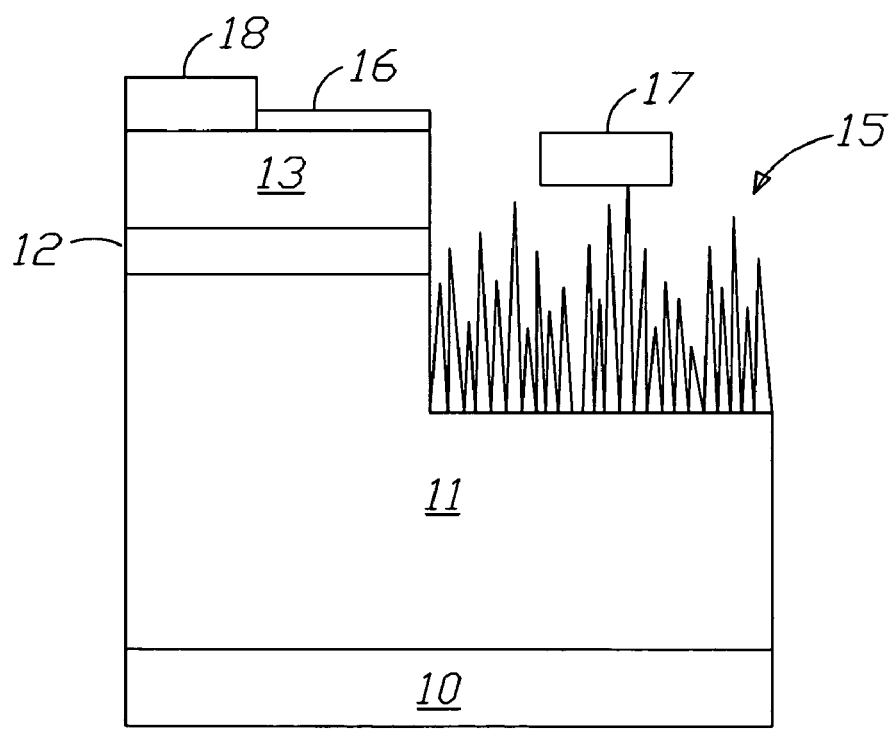

Refer from FIG. 3A to FIG. 3D, the present invention includes a first semiconductor layer 11 formed over a substrate 10, a light emitting layer 12 over the first semiconductor layer 11, a second semiconductor layer 13 over the light emitting layer 12, and a metal oxide layer 14 over the second semiconductor layer 13. In this embodiment, the metal oxide layer 14 uses titanium dioxide (TiO2) as an example. The titanium dioxide is irregularly disposed on top of the second semiconductor layer 13. Then run the etching process by an inductively coupled plasma (ICP) etcher. Refer to FIG. 3B, an irregular surface due to irregular disposition of titanium dioxide is resulted in. A scattering layer 15 having various etching depth resulted from irregular disposition of TiO2 is formed over part of the first semiconductor layer 11. Later, a transparent conductive layer 16 is formed over part of the second semiconductor layer 13 while a second electrode 18 is arranged over part of the transparent conductive layer 16 as well as part of the second semiconductor layer 13. A first electrode 17 is disposed over the scattering layer 15.

The substrate 10 is an insulated substrate. The substrate 10 is made from one of the following materials: sapphire, silicon carbide (SiC), silicon (S), gallium arsenide (GaAs), lithium aluminum oxide (LiAlO2), Lithium Gallium Oxide (LiGaO2), or Aluminum Nitride (AlN). The first semiconductor layer is an n-type gallium nitride semiconductor layer and the second semiconductor layer is a p-type gallium nitride semiconductor layer.

Figure 4:
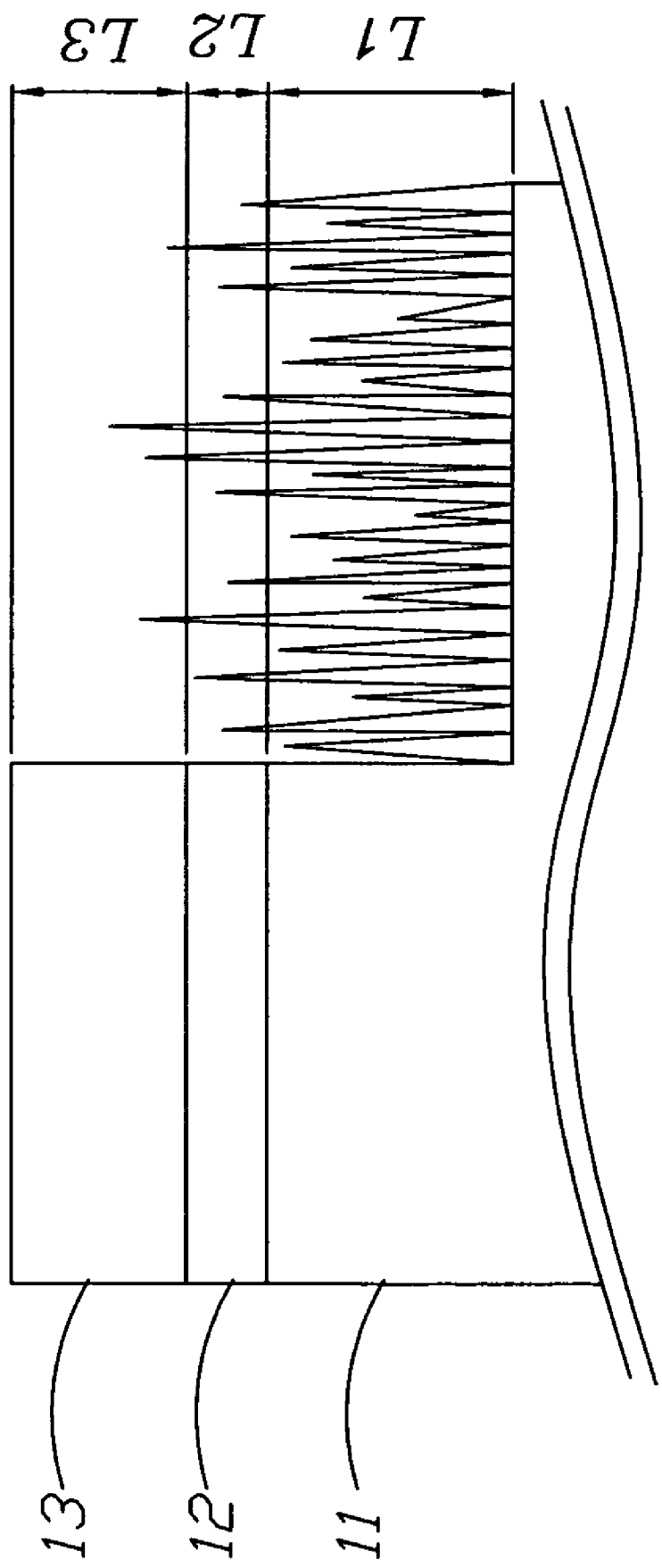
FIG. 4, an enlarged schematic drawing of a scattering layer of an embodiment in accordance with the present invention.

Referring to FIG. 4, it can be seen that due to the irregular disposition of titanium oxide (TiO2) and with various etching depths, the scattering layer 15 may have various combinations of L1, L2 or L3 and is therefore determined by disposition of titanium dioxide as well as etching time. Thus the scattering layer 15 can be formed by removal of layer L1-material of the first semiconductor layer, L1 plus L2, removal of materials of the first semiconductor layer and the light emitting layer, or L1, L2 plus L3, removal of materials of the first semiconductor layer, the light emitting layer and the second semiconductor layer.

Figure 5A:
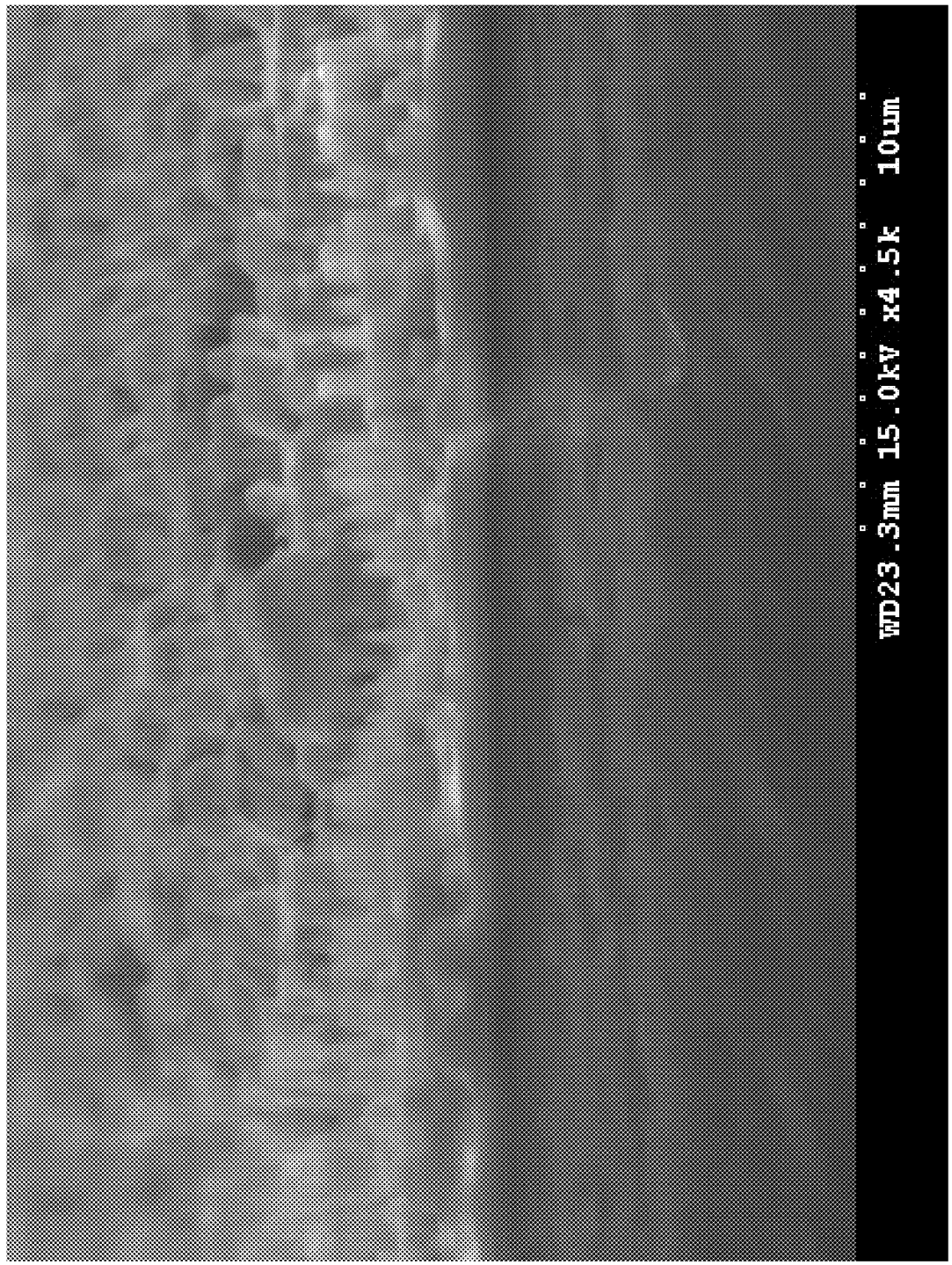
FIG. 5A is SEM (Scanning Electron Microscope) cross section of a scattering layer of an embodiment in accordance with the present invention.
Figure 5B:
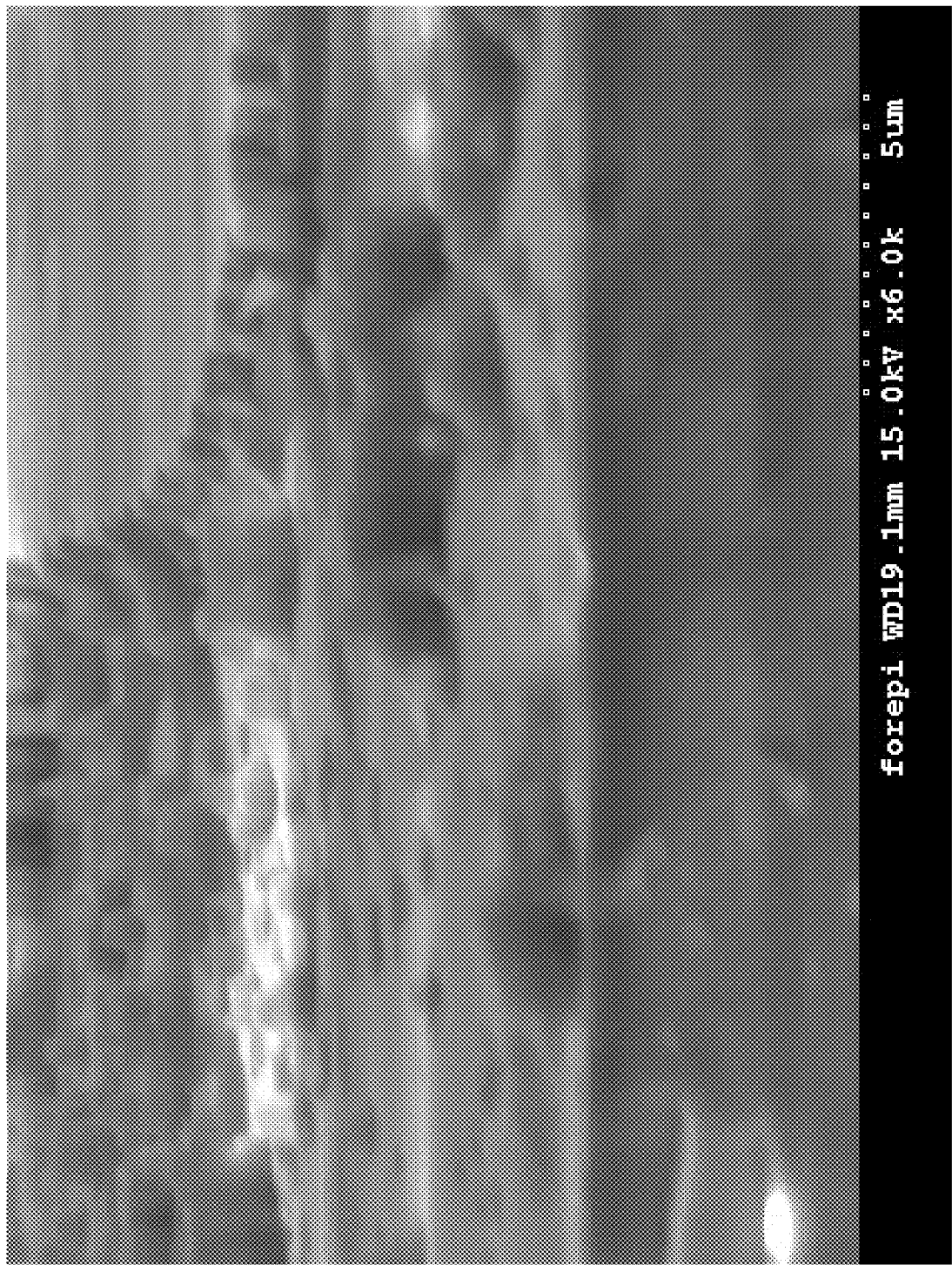
FIG. 5B is SEM cross section of a scattering layer of an embodiment in accordance with the present invention.

Moreover, referring to FIG. 5A & FIG. 5B, it is learned that the height of the scattering layer can be L1, L2, L3 or combinations of them.

Figure 6A:
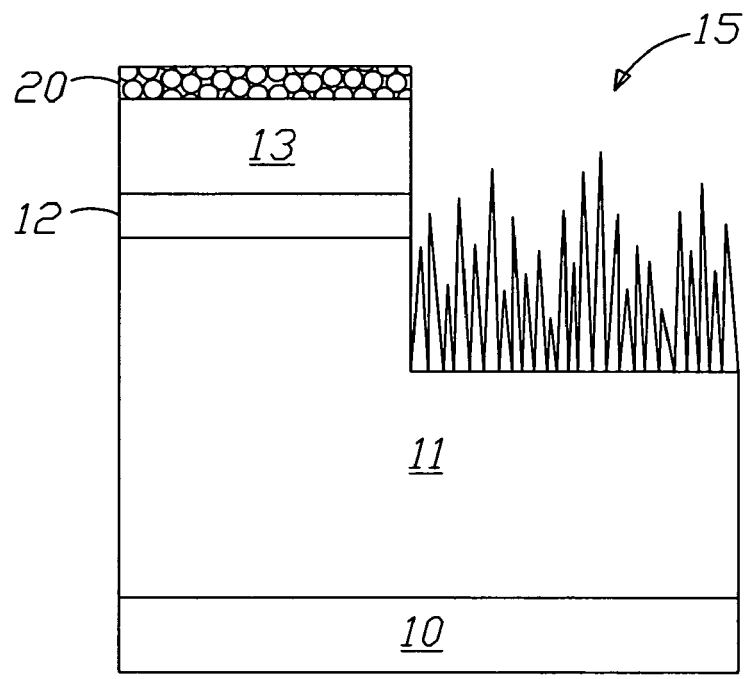
FIG. 6A to FIG. 6B are schematic drawings showing manufacturing processes of another embodiment according to the present invention.
Figure 6B:
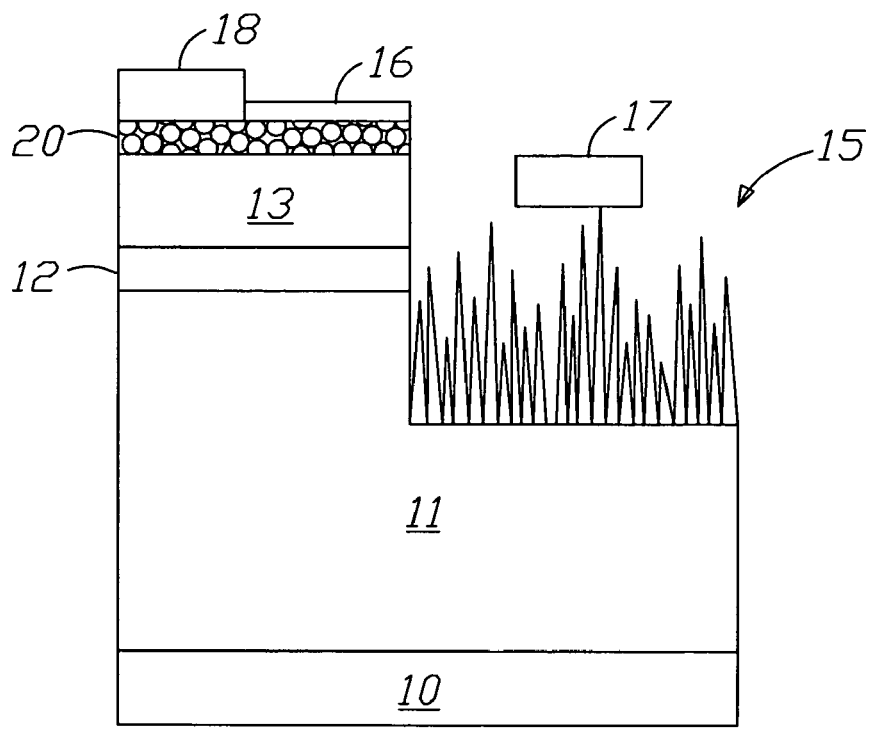

Refer from FIG. 6A to FIG. 6B, after finishing disposition of the scattering layer 15, a refractive layer 20 is arranged over the second semiconductor layer 13. The refractive layer 20 is made from metal oxide. In this embodiment, titanium dioxide (TiO2) is taken as an example. For increasing irregular scattering effect, a transparent conductive layer 16 is disposed on part of the refractive layer 20 while a second electrode 18 is disposed on part of the refractive layer 20 as well as part of the transparent conductive layer 16.

In summary, the present invention forms a scattering layer over a first semiconductor layer by etching so as to make light output form LED in single direction turn into multi-directional scattering.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A multidirectional light scattering light emitting diode comprising:
   a substrate;
   a first semiconductor layer disposed over the substrate;
   a light emitting layer over the first semiconductor layer;
   a second semiconductor layer over the light emitting layer;
   a transparent conductive layer disposed over part of the second semiconductor layer;
   a scattering layer with scattering surface arranged over the first semiconductor layer;
   a first electrode disposed on the scattering layer; and
   a second electrode arranged over part of the second semiconductor layer and part of the transparent conductive layer.

2. The device as claimed in claim 1, wherein the substrate is an insulated substrate.

3. The device as claimed in claim 1, wherein the substrate is made from sapphire, silicon carbide (SiC), silicon (Si), gallium arsenide (GaAs), lithium aluminum oxide (LiAlO2), Lithium Gallium Oxide(LiGaO2), or Aluminum Nitride (AlN).

4. The device as claimed in claim 1, wherein the scattering layer is formed by removing material from a combination of two or three of the following: the first semiconductor layer, the light emitting layer and the second semiconductor layer, said scattering layer thereby being disposed over the first semiconductor layer.

5. The device as claimed in claim 1, wherein the scattering layer is a first semiconductor layer.

6. The device as claimed in claim 1, wherein a refractive layer is disposed between the second semiconductor layer and the transparent conductive layer.

7. The device as claimed in claim 6, wherein the refractive layer is a metal oxide layer.

8. The device as claimed in claim 7, wherein the metal oxide layer is made from titanium dioxide (TiO2).

9. The device as claimed in claim 7, wherein the metal oxide layer is irregularly disposed on surface of the second semiconductor layer.

10. The device as claimed in claim 1, wherein the transparent conductive layer is made from indium tin oxide (ITO).

11. The device as claimed in claim 1, wherein the first semiconductor layer is a n-type gallium nitride semiconductor layer.

12. The device as claimed in claim 1, wherein the second semiconductor layer is a p-type gallium nitride semiconductor layer.

13. The device as claimed in claim 1, wherein the scattering layer is columnar structure.

14. The device as claimed in claim 1, wherein the scattering layer is needle-shape structure.

* * * * *